United States Patent
Deimerly et al.

(10) Patent No.: US 9,834,432 B2
(45) Date of Patent: Dec. 5, 2017

(54) MICROELECTROMECHANICAL AND/OR NANOELECTROMECHANICAL STRUCTURE WITH A VARIABLE QUALITY FACTOR

(71) Applicant: COMMISSARIAT A L'ENERGIE ATOMIQUE ET AUX ENE ALT, Paris (FR)

(72) Inventors: Yannick Deimerly, Grenoble (FR); Guillaume Jourdan, Brignais (FR); Patrice Rey, St Jean de Moirans (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 764 days.

(21) Appl. No.: 14/260,539

(22) Filed: Apr. 24, 2014

(65) Prior Publication Data
US 2014/0318906 A1    Oct. 30, 2014

(30) Foreign Application Priority Data
Apr. 25, 2013    (FR) ...................... 13 53789

(51) Int. Cl.
B81B 7/00    (2006.01)
G01P 15/08    (2006.01)
G01C 19/5726    (2012.01)

(52) U.S. Cl.
CPC ............ B81B 7/0016 (2013.01); B81B 7/008 (2013.01); B81B 2201/025 (2013.01);
(Continued)

(58) Field of Classification Search
CPC ...... B81B 2201/0228; B81B 2201/025; B81B 7/008; B81B 2201/0235;
(Continued)

(56) References Cited

U.S. PATENT DOCUMENTS 5,349,855 A * 9/1994 Bernstein ........... G01C 19/5719
                                                      73/504.16
5,417,312 A * 5/1995 Tsuchitani .............. G01P 1/003
                                                      188/181 A
(Continued)

FOREIGN PATENT DOCUMENTS

CN    101877811 A    11/2010
CN    102893128 A     1/2013
(Continued)

OTHER PUBLICATIONS

U.S. Appl. No. 14/737,761, Jun. 12, 2015, Jamaa, et al.
(Continued)

Primary Examiner — Lisa Caputo
Assistant Examiner — Punam Roy
(74) Attorney, Agent, or Firm — Oblon, McClelland, Maier & Neustadt, L.L.P.

(57) ABSTRACT

Inertial sensor comprising a fixed part and at least one mass suspended from the fixed part and means of damping the displacement of the part suspended from the fixed part, said damping means being electromechanical damping means comprising at least one DC power supply source, one electrical resistor and one variable capacitor in series, said variable capacitor being formed partly by the suspended part and partly by the fixed part such that displacement of the suspended part causes a variation of the capacitance of the variable capacitor.

17 Claims, 12 Drawing Sheets

(52) U.S. Cl.
CPC .. *G01C 19/5726* (2013.01); *G01P 2015/0882* (2013.01); *Y10T 29/49082* (2015.01)

(58) Field of Classification Search
CPC ........... B81B 2201/0242; B81B 7/0016; G01P 1/003; G01P 2015/0882
See application file for complete search history.

(56) References Cited

U.S. PATENT DOCUMENTS

| | | | |
|---|---|---|---|
| 6,930,487 B2 * | 8/2005 | North, Jr. ............... | H02N 1/006 310/317 |
| 7,038,829 B2 | 5/2006 | Bernstein | |
| 7,273,762 B2 | 9/2007 | Gogoi | |
| 8,047,072 B2 | 11/2011 | Ball et al. | |
| 8,047,075 B2 | 11/2011 | Nasiri et al. | |
| 8,094,839 B2 | 1/2012 | Lee et al. | |
| 8,616,059 B2 | 12/2013 | Walther et al. | |
| 8,875,578 B2 * | 11/2014 | Smith ................... | G01P 15/125 73/504.12 |
| 9,377,483 B2 | 6/2016 | Egretzberger et al. | |
| 2003/0061878 A1 * | 4/2003 | Pinson ............... | G01C 19/5719 73/514.33 |
| 2004/0113514 A1 * | 6/2004 | North, Jr. ............... | H02N 1/006 310/309 |
| 2006/0266118 A1 * | 11/2006 | Denison ............ | G01C 19/5719 73/514.32 |
| 2007/0227247 A1 * | 10/2007 | Weber ................ | G01C 19/5726 73/496 |
| 2010/0181156 A1 | 7/2010 | Quer et al. | |
| 2010/0277229 A1 | 11/2010 | Lee et al. | |
| 2010/0295138 A1 * | 11/2010 | Montanya Silvestre ............ | B81C 1/00246 257/415 |
| 2010/0310839 A1 | 12/2010 | Rey et al. | |
| 2011/0163955 A1 | 7/2011 | Nasiri et al. | |
| 2011/0219875 A1 | 9/2011 | Walther et al. | |
| 2011/0252887 A1 | 10/2011 | Cardarelli | |
| 2012/0164399 A1 | 6/2012 | Rey et al. | |
| 2013/0000411 A1 | 1/2013 | Robert et al. | |
| 2013/0104656 A1 * | 5/2013 | Smith ................... | G01P 15/125 73/514.32 |
| 2013/0199263 A1 | 8/2013 | Egretzberger et al. | |
| 2014/0076024 A1 | 3/2014 | Duraffourg et al. | |
| 2014/0331770 A1 | 11/2014 | Jourdan et al. | |
| 2015/0013455 A1 | 1/2015 | Deimerly | |
| 2016/0097789 A1 * | 4/2016 | Clark ................... | G01P 15/0802 73/514.01 |
| 2016/0196923 A1 * | 7/2016 | Van Kampen ........... | H01G 5/18 361/278 |

FOREIGN PATENT DOCUMENTS

| | | |
|---|---|---|
| CN | 103003704 A | 3/2013 |
| EP | FR 2 951 222 A1 | 4/2011 |
| WO | WO 2006/105314 A1 | 10/2006 |
| WO | WO 2012/161690 A1 | 11/2012 |
| WO | WO 2013/033613 A2 | 3/2013 |

OTHER PUBLICATIONS

Combined Chinese Office Action and Search Report dated Sep. 29, 2016 in Chinese Patent Application No. 201410171576.4 (with English translation of the Office Action and English translation of categories of cited documents).
U.S. Appl. No. 14/519,390.
U.S. Appl. No. 14/661,430.
S. Adhikari, et al., "Identification of Damping: Part 1, Viscous Damping", Journal of Sound and vibration, 2001, 243,(1), pp. 43-61.
Dorel Homentcovschi : "Modeling of Viscous Damping of Perforated Planar Microstructures. Applications in Acoustics", Journal of the Acoustical Society of America, vol. 116, Issue 5, 2004, pp. 2939-2947.
Mikail Yücetas, "A High-Resolution Accelerometer with Electrostatic Damping and Improved Supply Sensitivity", IEEE Journal of Solid-State Circuits, vol. 47, N° 7, Jul. 2012, 10 pages.
Joshua E-Y Lee: "Study of Lateral Mode SOI-MEMS Resonators for Reduced Anchor Loss", Journal of Micromechanics and Microenginering, vol. 21, 2011, 11 pages.
Amy Duwel: "Experimental Study of Tthermoelastic Damping in MEMS Gyros", Sensor and Actuator A, vol. 103, 2003, pp. 70-75.
Zhili Hao "Energy Loss Mechanisms in a Bulk-Micromachined Tuning Fork Gyroscope", IEEE Sensors 2006, 4 pages.
M.Bao et al.: "Squeeze Film Air Damping in MEMS", Sensors and Actuators A, vol. 136, 2007, pp. 3-27.
Minhang Bao et al.: "Modified Reynolds' Equation and Analytical Analysis of Squeeze-Film Air Damping of Perforated Structures", J. Micromech. Microeng., vol. 13, 2003, pp. 795-800.
G. Jourdan et al., "Tuning the Effective Coupling of an AFM Lever to a Thermal Bath", Nanotechnology vol. 18, 2007, 7 pages.
T. Barois et al.: "Ohmic Electromechanical Dissipation in Nanomechanical Cantilevers", Physical Review B 85, 075407, 2012, 7 pages.
D.R. Schmid et al.: "Magnetic Damping of a Carbon Nanotube Nano-Electromechanical Resonator", New Journal of Physics, vol. 14, 2012, 9 pages.
Johanes Rieger et al.: "Frequency and Q factor control of nanomechanical resonators", Appl. Phys. Lett., vol. 101, 2012, pp. 103-110.
Alexander A. Trusov, et al., "Micromachined Rate Gyroscope Architecture with Ultra-High Quality Factor and Improved Mode Ordering", Sensors Actuators A: Phys. 2010, 9 pages.
G. Jourdan et al., "NEMS-Based Heterodyne Self-Oscillator", Sensors and Actuators A: Physical, vol. 189, Jan. 15, 2013, pp. 512-518.
T. Fujimori et. al., "Tiny (0.72mm$^2$) Pressure Sensor Integrating MEMS and CMOS LSI with Back-End of Line MEMS Platform", Transducer'09, 2009, pp. 1924-1927.
Ph. Robert, V. Nguyen, et al.: "M&NEMS: A New Approach for Ultra-Low Cost 3D Inertial Sensor" IEEE Sensor Conference, 2009, 4 pages.
Dirk Ettelt et al.: "A Novel Microfabricated High Precision Vector Magnetometer" Sensors IEEE, 2011, pp. 2010-2013.
S. Mahon et al.: "Bulk Acoustic Wave Devices—Why, How, and Where They are Going", CS Mantech Conference, May 14-17, 2007, 4 pages.
French Preliminary Search Report dated Apr. 1, 2014 in French Application 13 53789, filed on Apr. 25, 2013 ( with English Translation of Categories of Cited Documents).
S Marco et al. "Analysis of electrostatic-damped piezoresistive silicon accelerometers", Sensors and Actuators A. 37, vol. 37-38, 1993, 6 pages.

* cited by examiner

MICROELECTROMECHANICAL AND/OR NANOELECTROMECHANICAL STRUCTURE WITH A VARIABLE QUALITY FACTOR

TECHNICAL FIELD AND PRIOR ART

This invention relates to a microelectromechanical and/or nanoelectromechanical structure with a variable quality factor, particularly an inertial sensor with a variable quality factor.

For example, the inertial sensor is an accelerometer, a gyroscope, a magnetometer or a pressure sensor formed by an MicroElectroMechanical System (MEMS) and/or a NanoElectroMechanical System (NEMS).

In general, the qualify factor of a micro or nanosystem may be expressed as the sum of the inverse values of various dissipation or damping sources. In general, the main source of damping applied to a microelectromechanical and/or nanoelectromechanical system is viscous damping.

A gyroscope has a given quality factor.

The electronics of the gyroscope are then designed to give a certain quality factor range. It may be useful to be able to vary the quality factor when the gyroscope is in the start up phase. For example, lowering the quality factor widens the start up range of the phase locked loop (PLL). And better actuation can be obtained by increasing the quality factor.

Furthermore, there is an increasing demand for structures including several MicroElectroMechanical Systems (MEMS) and/or NanoElectroMechanical systems, for example integrating at least one gyroscope and at least one accelerometer.

These systems are usually isolated in cavities, particularly to protect them from the external environment. The systems can then be placed in two distinct cavities or in the same cavity.

In the latter case especially, the two systems are necessarily in an environment at the same pressure.

A gyroscope requires a high quality coefficient for sensitivity reasons, a high quality coefficient for example being obtained by placing the gyroscope in an environment at low pressure. Conversely, a non-resonant or passive accelerometer, i.e. that does not require excitation means for its operation, requires a low quality factor, otherwise it will have a non-linear behaviour and may even be damaged in case of a shock. A low quality factor may be obtained by placing the accelerometer in an environment at ambient pressure to guarantee some damping of the accelerometer.

Consequently, integration of an accelerometer and a gyroscope in the same cavity creates problems for correct operation of the two sensors.

PRESENTATION OF THE INVENTION

Consequently, one purpose of this invention is to provide a device comprising at least one micro and/or nanoelectromechanical device comprising means of simply varying its quality factor, and that can easily be integrated into the structure of the micro and/or nanoelectromechanical system.

The purpose mentioned above is achieved by a micro and/or nanoelectromechanical system comprising means of electromechanical damping comprising an electrical circuit in which a power supply, at least one electrical resistor and at least one variable capacitor are connected in series, said capacitor being integrated into the structure of the micro and/or nanoelectromechanical system, such that displacement of the suspended mass of the system will cause a variation in the capacitance of the capacitor.

In other words, a source of damping for the suspended mass is introduced into a micro and/or nanoelectromechanical system, which can be used to vary the quality factor.

In one very advantageous example, at least one of the variable capacitors is formed partly from an electrode designed to test the system.

Thus, the damping means use existing means in the system and therefore it is easier to produce them.

Preferably, the resistor is made as close to the system as possible, for example it is made in the substrate, for example by etching a gauge in the substrate and/or modifying its doping, which limits parasite capacitances and can give higher resistance values.

The damping source may be controllable. For example in the case of a gyroscope, such a damping source can reduce its quality factor on start up.

In the case of a device containing a gyroscope and an accelerometer in the same low pressure cavity, the quality factor of the accelerometer can easily be reduced with the invention so as to compensate for the low pressure. The pressure is for example between 1 mBar and several mBar.

The subject-matter of this invention is then a microelectromechanical and/or a nanoelectromechanical structure comprising at least a fixed part and at least a part suspended from the fixed part and means of damping the displacement of the suspended part relative to the fixed part, said damping means being electromechanical damping means comprising at least one DC power supply source, at least one electrical resistor and at least one variable capacitor in series with the resistor, said at least one capacitor and said at least one resistor forming at least one loop with the power supply source, said variable capacitor being formed partly by the suspended part and partly by the fixed part, such that displacement of the suspended part causes a variation of the capacitance of the variable capacitor.

Advantageously, the structure comprises at least n assemblies comprising an electrical resistor and a variable capacitor in series with the resistor, said n assemblies being connected in parallel on the DC power supply source so as to form n loops with the same power supply source.

Very advantageously, n is an even number and the structure comprises a fixed part with n electrically independent patterns, the n variable capacitors in the n assemblies being formed by said n patterns in the fixed part, which are arranged on each side of the suspended part relative to a plane of symmetry of said suspended part.

In one example embodiment, the inertial mass comprises a comb with n teeth, and the fixed part comprises a comb with n teeth forming n patterns, the two combs being interdigitised such that one tooth of one comb and one tooth of another comb together form a variable capacitor.

In one example, the at least one variable capacitor is for example a variable air gap capacitor.

The air gap between the two capacitor electrodes may vary differently from one end of said capacitor to the other, for example in the case in which the two electrodes of the capacitor are not parallel to each other.

In another example, the at least one variable capacitor is a variable area capacitor.

Advantageously at least one electrode of the at least one variable capacitor is formed by at least one test electrode of the structure.

Preferably, the electrical resistor is partly formed by the fixed part.

The resistor may be made and advantageously integrated into the fixed part, for example by etching a support that will form at least part of this fixed part and/or by transferring an element onto the fixed part and/or by doping of the support forming at least part of this fixed part. The pattern then formed by this resistor may for example be the pattern of a beam or a serpentine that may or may not be suspended from the substrate. The fixed part may be the substrate in which the suspended part is made or a substrate forming a cap.

The damping means may be controllable so as to apply a variable damping force.

The structure may comprise means of detecting displacements of the suspended part and form an inertial sensor. The inertial sensor can then be an accelerometer.

The structure may comprise means of exciting at least part of the suspended part. The damping means may then be controllable so as to apply a variable damping force, the inertial sensor being a gyroscope.

Another subject-matter of this invention is an assembly comprising at least two inertial sensors integrated onto a single substrate, at least one of the two inertial sensors is an inertial sensor according to this invention. The assembly may comprise a gyroscope and an accelerometer according to this invention, said gyroscope and said accelerometer being advantageously encapsulated in a same cavity, thanks to the use of damping means such that the accelerometer has a low quality factor.

Advantageously, the cavity in which the accelerometer is encapsulated is under low pressure.

Another subject-matter of this invention is a process for making a structure or an assembly according to this invention, comprising the following steps:
  make at least one electrical resistor of the damping means on a support that will at least partly form the fixed part,
  make the suspended part and the fixed part of the structure,
  release at least the suspended part.

The step to make said at least electrical resistor comprises a doping step so as to control the electrical resistivity of the part of the material in which the at least one resistor is made.

The production process may include a step to form a protective layer on said electrical resistor before production of the suspended part and the fixed part of the structure.

BRIEF DESCRIPTION OF THE DRAWINGS

This invention will be better understood after reading the description given below and the appended drawings in which.

DETAILED PRESENTATION OF PARTICULAR EMBODIMENTS

In this description, the term MEMS is used to refer indifferently to a microelectromechanical or nanoelectromechanical system.

In one application, such a system is an inertial system. It may be a resonant or active inertial system, i.e. using excitation means and detection means such as a gyroscope or an active accelerometer, or it may be a non-resonant or passive inertial sensor i.e. not using excitation means, the signal to be measured being produced by the external environment only, for example such as an accelerometer a magnetometer, or a pressure sensor.

Figure 1A:
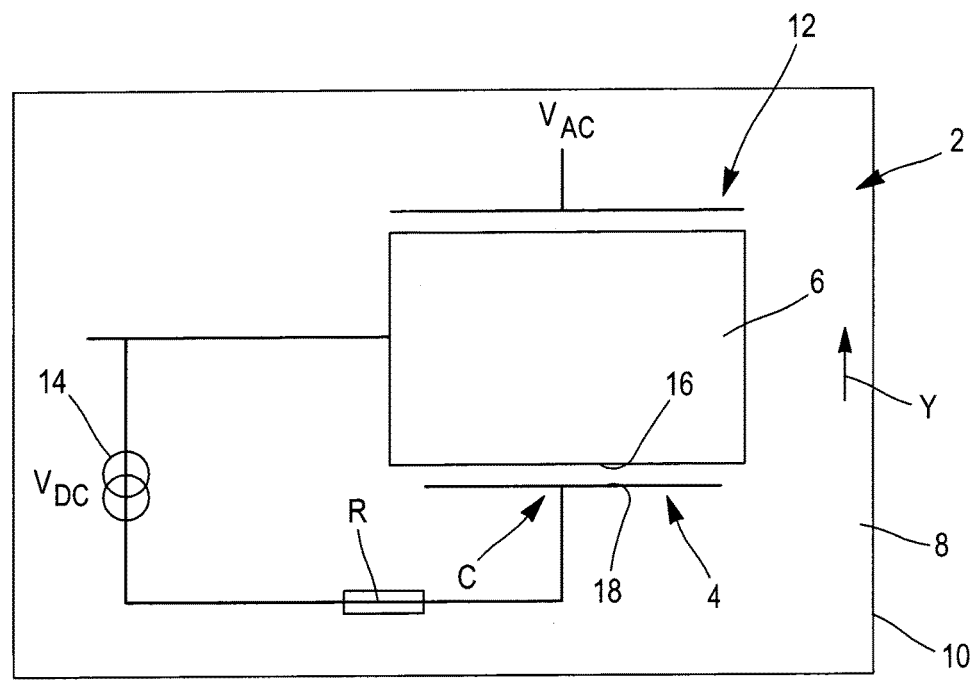
FIG. 1A is a diagrammatic view of a microelectromechanical system making use of damping means according to the invention.

FIG. 1A is a diagrammatic view of a MEMS 2 and electromechanical damping means 4. The MEMS 2 comprises a part 6 suspended from a fixed part 8 on a substrate 10, the suspended part 6 forming an inertial mass. The MEMS 2 also comprises capacitive type detection means 12 in the example shown. For example, the MEMS 2 is an accelerometer; acceleration causes displacement of the inertial mass 6 relative to the fixed part 8, the relative displacement of the combs is then detected by measuring the variation of the capacitances.

In the present invention, a voltage DC power supply source may be at constant voltage or a constant charge.

In the example in FIG. 1A, the electromechanical damping means 4 comprise a DC power supply source 14, an electrical resistor R and a variable capacitor C connected in series to form a loop. The variable capacitor C is such that its capacitance depends on the position of the inertial mass 6 relative to the fixed part 8.

In the example shown diagrammatically, the capacitor C is represented by two plates 16, 18 facing each other, one plate 16 being fixed relative to the inertial mass 6 and the other plate 18 being fixed relative to the fixed part 8. Thus, when the inertial mass moves, the plates 16, 18 move towards or away from each other causing a variation in the capacitance of the capacitor by varying the air gap.

The capacitor is oriented as a function of the expected displacement of the inertial mass. In FIG. 1A, the expected displacement takes place along the Y axis, and during this displacement the plates 16, 18 move towards or away from each other.

The electrical resistor R may be placed on the substrate and it may be connected to the capacitor and the power supply source 14.

Preferably, the resistor is integrated as close to the MEMS as possible, which will reduce the parasite capacitances. To achieve this, the resistor is advantageously made in the substrate, for example by etching, the resistor then being similar to a gauge or a beam. It is long relative to its thickness and to its width so that it has a high electrical resistance. Furthermore and preferably, doping of the material of the substrate forming the resistor is modified to reach a relatively high resistance value.

Figure 10A:
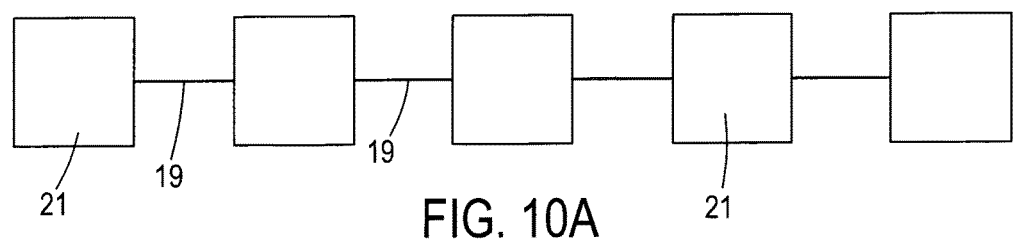
FIGS. 10A and 10B are diagrammatic views of example embodiments of resistors that can be used in this invention.
Figure 10B:
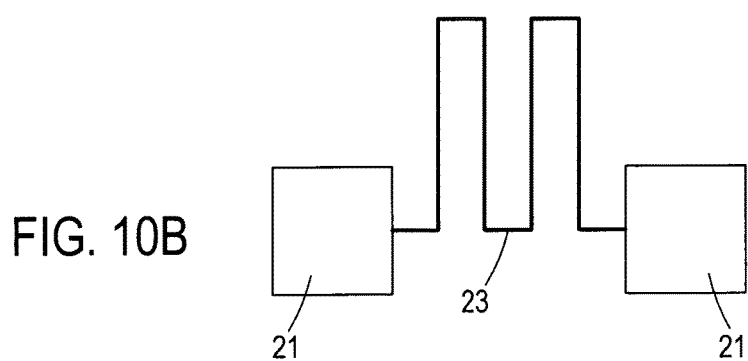

This resistor is electrically isolated from the remainder of the system. It may be in the form of a gauge, beam or filament and also it may or may not be suspended. FIG. 10A shows a diagrammatic example of a resistor formed by several suspended beams 19, the beams 19 being connected by anchors 21. In FIG. 10B, the resistor is formed by a filament 23 anchored at its two ends by anchors 21. In the example shown, the filament is in the form of a coil but this is in no way limitative.

Electrical isolation by pn junction, i.e. by suddenly changing the doping, can be envisaged. This isolation has the advantage that it does not make use of a suspended "beam" in the mechanical sense of the term.

As a variant, this gauge or beam can be made from a material different from the material of the substrate, the material having the required electrical resistance properties.

Figure 3A:
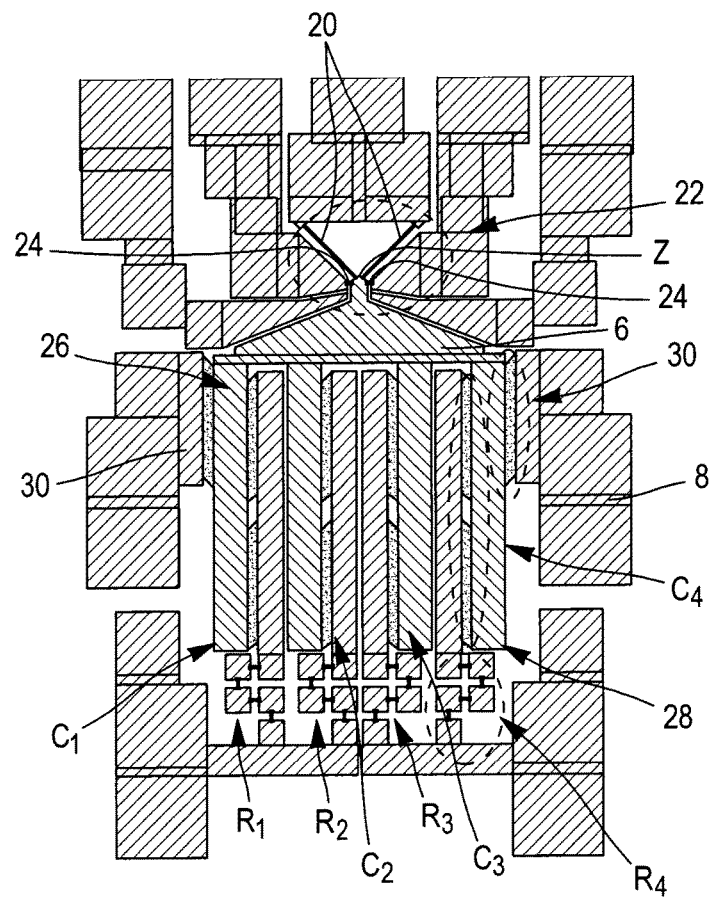
FIGS. 3A, 3B and 3C are top views of practical embodiments of three example embodiments of a microelectromechanical system according to the invention.
Figure 3B:
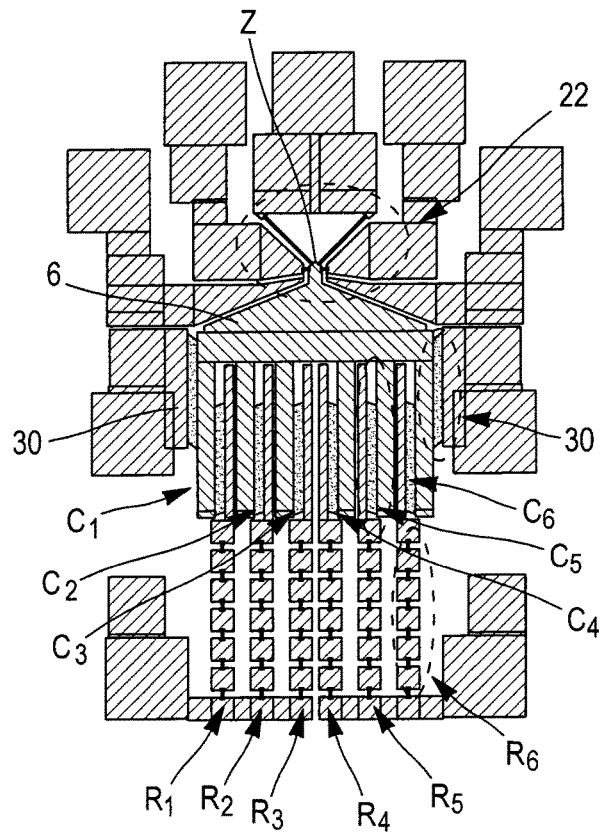

It will be understood that the resistor R may be formed from several electrical resistors in series as shown for example in FIGS. 3A to 3B.

The damping means function as follows: by polarising the loop with a non-zero voltage, an electrostatic attraction force appears between the plates of the capacitor. Furthermore, displacement of the inertial mass 6 causes a variation of the capacitance, which causes a variation of the current circulating in the loop. The current thus generated is transformed into heat in the resistor.

Therefore the energy dissipated by the Joule effect is related to the movement of the inertial mass. This energy dissipation assures electromechanical damping of the displacement of the inertial mass.

Figure 1B:
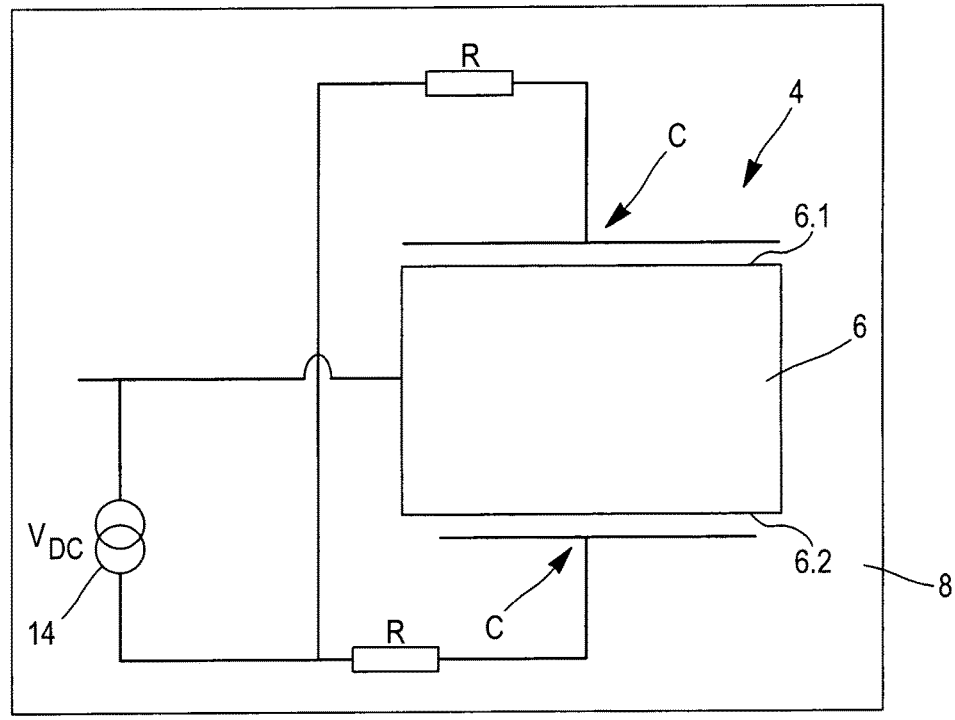
FIG. 1B is a diagrammatic view of an advantageous variant embodiment of the system in FIG. 1, in which the damping means act symmetrically on the inertial mass.

FIG. 1B shows another advantageous example of damping means 4 according to the invention. The damping means 4 are arranged symmetrically relative to the inertial mass 6 and act symmetrically on it, which prevents the system from leaving its equilibrium position and reduces risks of sticking. In the diagrammatic view shown in FIG. 1B, the damping means comprise a resistor R and a capacitor C in series, one of the plates or electrodes of the capacitor is supported by an edge 6.1 of the inertial mass and a resistor R and a capacitor C in series, one of the plates or electrodes of the capacitor is supported by the facing edge 6.2 of the inertial mass along the Y direction.

Due to this symmetric damping, the system remains around its equilibrium position. By leaving the system close to its equilibrium position, damping does not modify any other performances of the sensor such as its sensitivity or its dynamic range.

It will be understood that the invention can be used to make asymmetric damping, in which case the system functions outside its equilibrium zone slightly reducing its operating range. The damping obtained is equivalent in terms of amplitude and its implementation is simpler because for example it can only use one resistor and one variable capacitor.

Figure 2:
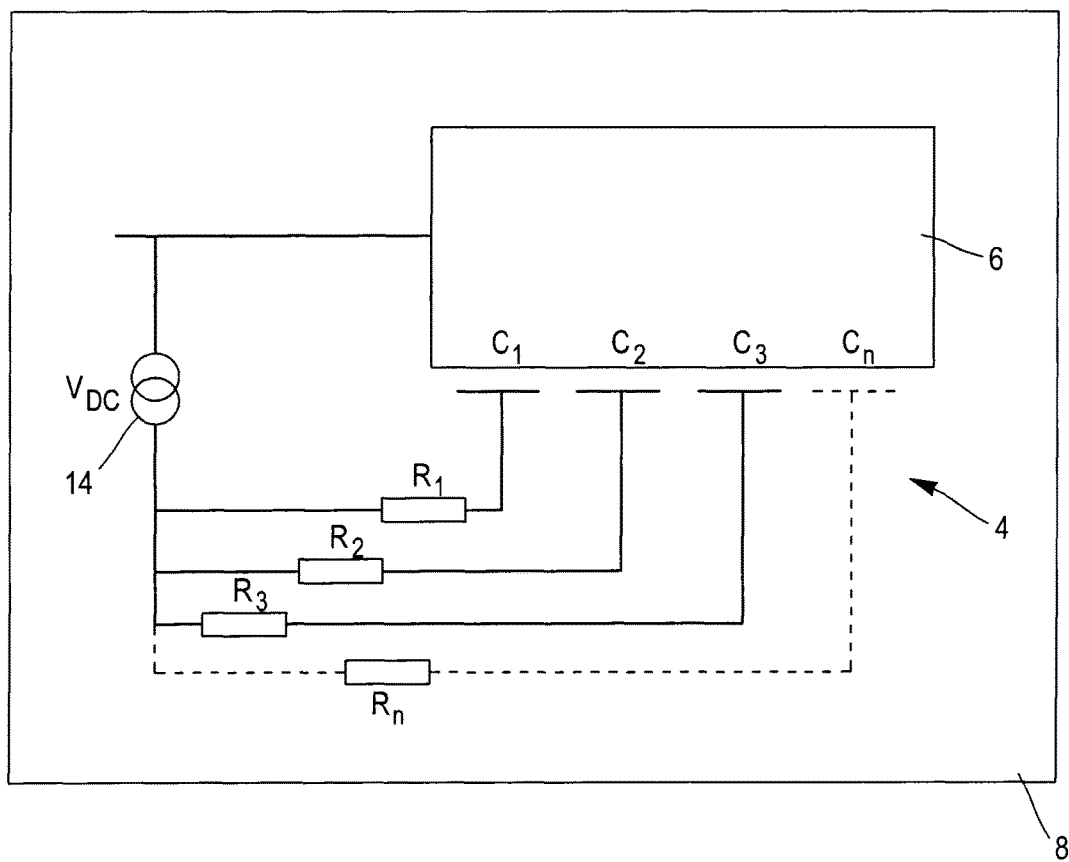
FIG. 2 is a diagrammatic view of another example embodiment of a microelectromechanical system making use of damping means according to the invention providing increased damping.

FIG. 2 shows another example embodiment in which the damping means 4 comprise a DC voltage source $V_{DC}$ 14, n resistors R1, R2, . . . , Rn and variable capacitor C1, C2, . . . , Cn couples in series, the couples being connected in parallel to the voltage source. Thus, the damping means comprise several RC couples each with its own cut-off frequency. The damping produced by each loop is additional while maintaining an unchanged cut-off frequency.

The damping itself has a transfer function with gain and a cut-off frequency. Thus, for a given work frequency, there is a limit of resistance and capacitance values beyond which damping becomes zero. Use of a single RC couple in series with the voltage source limits damping so that the usage frequency is less than the cut-off frequency.

If several RC couples are associated in parallel, damping can be increased because it is the result of the sum of damping of each RC couple, without reducing the cut-off frequency that is equal to the average of the cut-off frequencies of each RC couple.

As a variant, damping may be increased with a single RC couple in series with a power supply source by increasing the power supply voltage as shown in the graphic view in FIG. 6 described below.

The damping means 4 can be made so that they are symmetrical about the inertial mass as shown in FIG. 1B, the same numbers of R, C couples acting on each side of the inertial mass.

This configuration allows to further suppress the non linear terms and the static force components by balancing the forces applied by at least two sets of electrodes/resistors.

In the example of one couple RCV acts on each side, this configuration allows to balance the static forces generated by the polarisation of the capacities C1 and C2. When the mass is at rest, the sum of electrostatic forces which act on the mass is equal to zero. In addition the generated non linear terms for each of the to forces F1 and F2 compensate to each other.

Figure 11A:
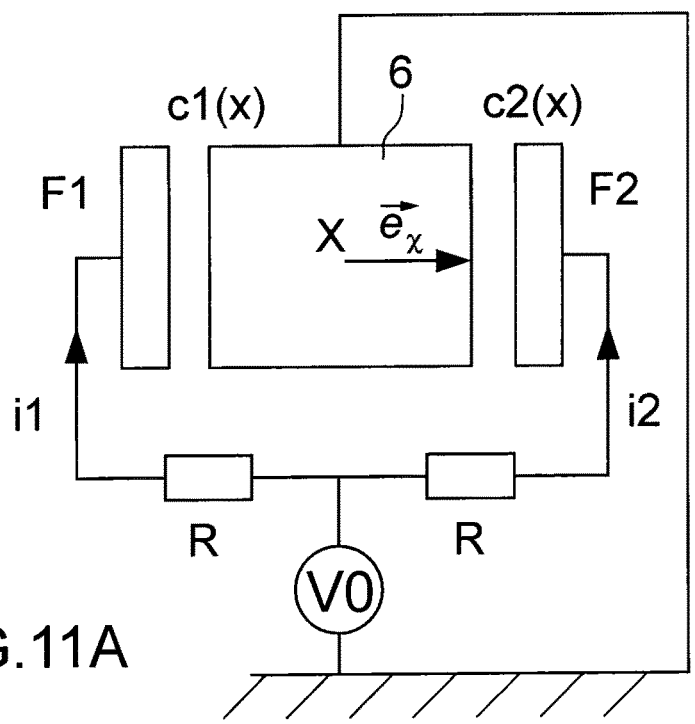
FIG. 11A is a completed FIG. 1B.

On FIG. 11A, the forces applied by the capacitor and the current flowing in the couples are represented.

Every configuration for which:

$$C1'=-C2'=C' \qquad (1)$$

C' being the derivative of C with respect to the degree of freedom x.

Indeed,

The forces on the masses can be written: $\vec{F}_1 = 0.5 C_1' V_1^2$ and $\vec{F}_2 = 0.5 C_2' V_2^2$ The voltages at the capacities terminals are: $V_1 = V_0 - Ri_1$ and $V_2 = V_c - Ri_2$ The currents $i_1 = V_0 C_1' \dot{x}$ and $i_2 = V_0 C_2' \dot{x}$ Considering (1), the total force on the system can be written:

$$\vec{F} = \vec{F}_1 + \vec{F}_2 = 0.5 C'(V_1^2 - V_2^2)$$

$$\vec{F} = 2RV_0^2 C'^2 \dot{x} \vec{e}_x$$

The force generated by one electrode generates three components:

$$\vec{F}_1 = 0.5 C'(V_0^2 - 2V_0^2 RC'\dot{x} + (RV_0 C'\dot{x})^2)$$

But, the first component and the last component might bring disturbances for the good operation of the MEMS.

Figure 11B:
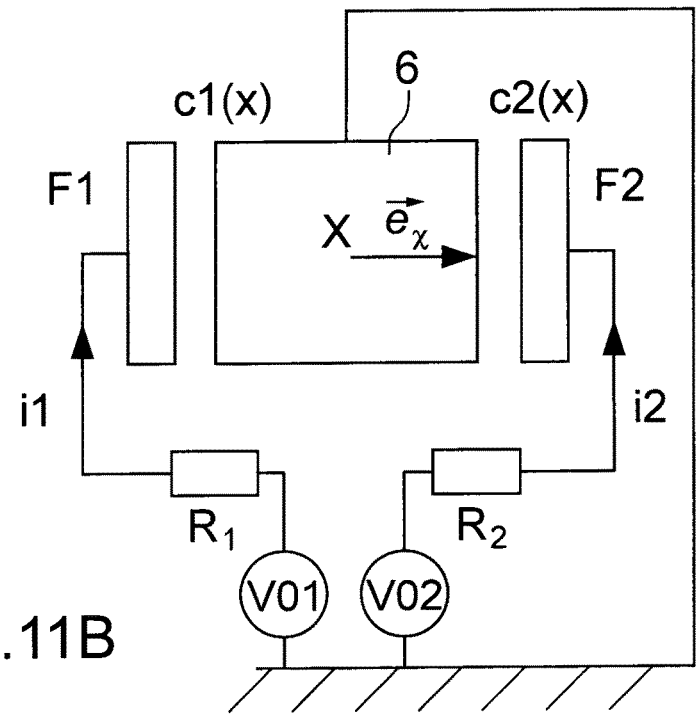
FIG. 11B is a diagrammatic view of a variant of the system of FIG. 1B in which the two assemblies R, C are connected in series with two different power supply sources.

On FIG. 11B, one can see an example of damping means comprising two assemblies R1, C1 and R2, C2 which are symmetrical with respect to the inertial mass 6, each assembly R1, C1, R2, C2 being connected in series with its own power source V01, V02 respectively. The configuration allows to balance the forces if the system is not balance, i.e. if R1 and R2 are different and/or if C1 and C2 are different. FIG. 3A shows a practical example embodiment of a structure comprising a MEMS and damping means according to the example embodiment in FIG. 2.

The MEMS 2 comprises an inertial mass 6 free to rotate about a Z axis relative to the fixed part 8. The inertial mass 6 is suspended from the fixed part 8 by means of two secant beams 20 forming the pivot link 22 with the Z axis.

The detection means are formed by two piezoresistive gauges 24 mounted differentially and arranged on each side of the pivot link 22. When one of the gauges 24 is deformed in extension, the other is deformed in compression. As a variant, it might be possible to have a single gauge.

The damping means 4 comprise several variable capacitors, four in the example shown denoted by C1, C2, C3, C4. Each capacitor is formed by a tooth of a comb 26 fixed to the inertial mass and a facing tooth of a comb 28 fixed to the fixed part. In the example shown, each comb has four teeth, the teeth being interdigitised. The teeth of each comb 26, 27 are electrically isolated from each other and the teeth of the two combs are isolated from each other. Resistors R1, R2, R3, R4 are formed in the substrate and are connected in series with each of the capacitors. In the example shown, the resistors are in the form of suspended gauges. For each capacitor, several resistive elements are connected in series in order to obtain the required resistance value and are connected in series with a capacitor. Each capacitor in series with one or several resistive elements forms an RC couple. The damping means then comprise several RC couples in parallel.

Pivoting of the inertial mass about the Z axis causes the teeth of the comb to move towards or away from each other and therefore to vary the capacitances of capacitors C1, C2, C3, C4. In this example embodiment, the capacitance variations are made principally by varying the facing surface areas.

The electrodes denoted 30 form test electrodes that will verify correct operation of the MEMS. In the example shown, these electrodes do not contribute to the damping means.

The capacitor and resistor couples are connected in parallel to the DC power supply source (not shown). As explained with reference to FIG. 2, damping values are added while maintaining a constant cut-off frequency.

FIG. 3B shows a variant of the system in FIG. 3A in which the damping means comprise six variable capacitors formed by two interdigitised combs. As for the system in FIG. 3A, the teeth of the combs are electrically isolated from each other, and resistors R1 to R6 are formed by several resistive elements in series. The resistive elements are aligned in this variant, while in the system in FIG. 3A, the resistive elements are oriented so as to form compact structures.

Figure 3C:
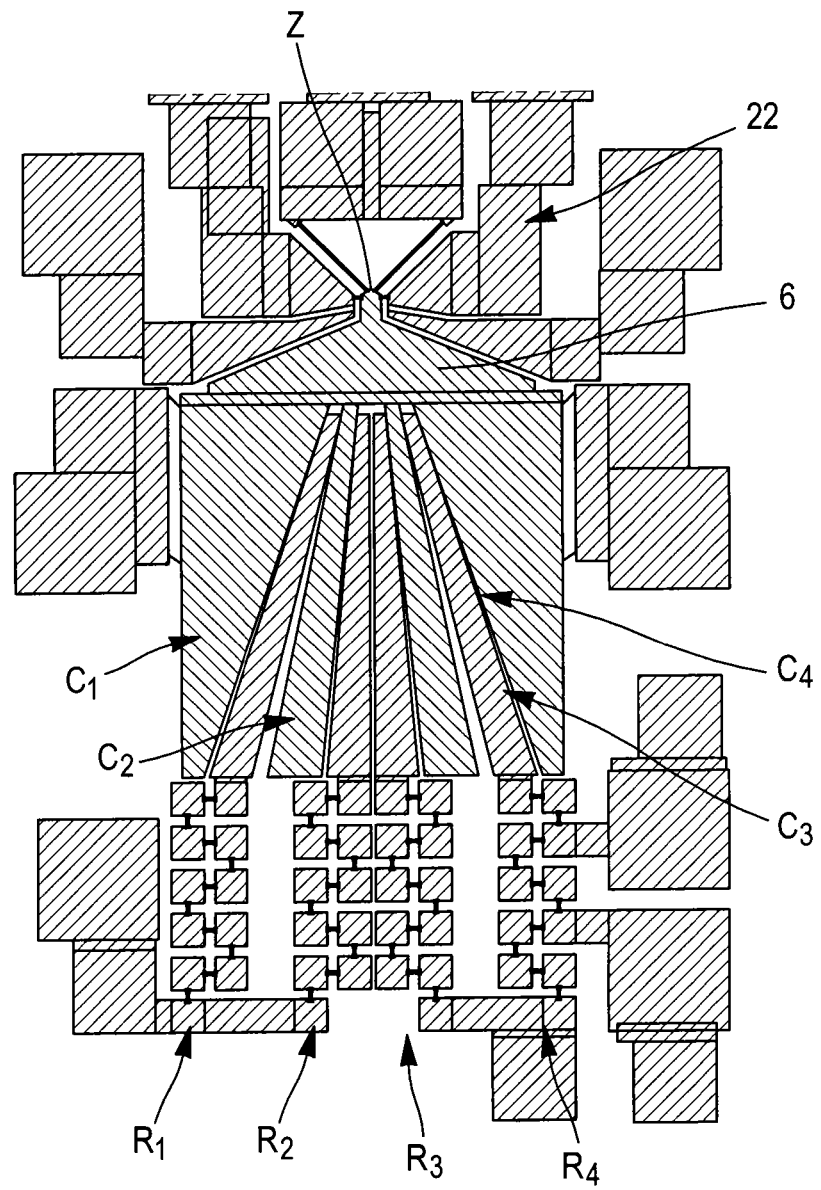

FIG. 3C shows another example embodiment in which the teeth of the combs have concurrent axes at the axis of rotation. The structure is organised around the axis of rotation. The resistors are similar to those in the system in FIG. 3A. In this variant, capacitance variations are the result of a variation in the air gap.

In the systems in FIGS. 3A, 3B and 3C, the damping means are made to be symmetric about the inertial mass so as to apply damping to the inertial mass by symmetric electromechanical coupling.

Figure 4A:
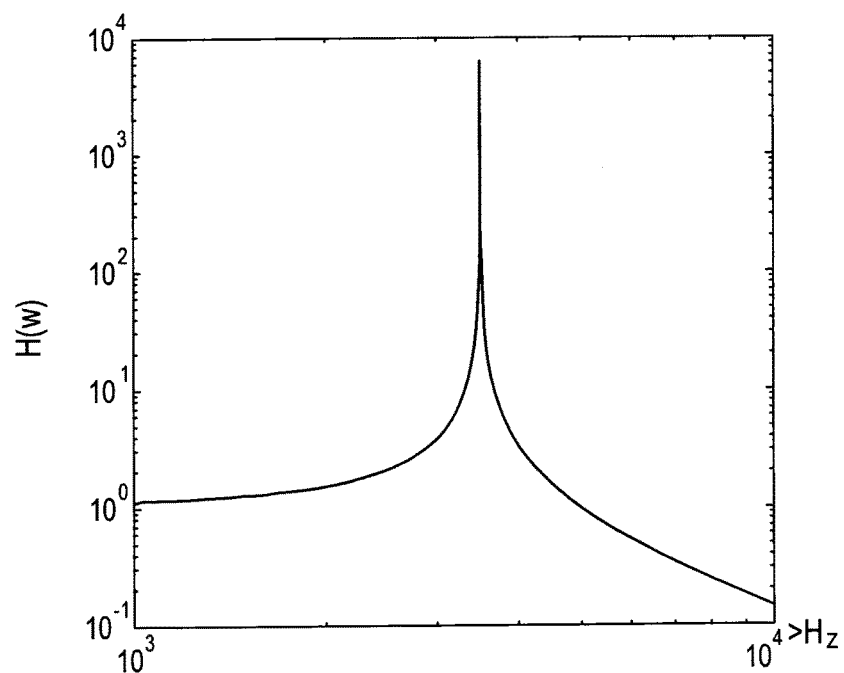
FIG. 4A is typical graphic view of the transfer function of a microelectromechanical system

FIG. 4A shows the general transfer function for displacement of the inertial mass as a function of the frequency in Hz, for example of the system in FIG. 3A or FIG. 3B.

The total transfer function of the system displacement may be written:

$$\frac{X}{F} = \frac{1}{k - m\omega^2 + \frac{C'^2 R^2 \cdot V_0^2 \omega^2 C}{1 + R^2 C^2 \omega^2} + j\left(\omega\gamma_m + \frac{C'^2 R \cdot V_0^2 \omega}{1 + R^2 C^2 \omega^2}\right)}$$

where k is the stiffness of the system,
m is the mass of the inertial mass,
C is the capacitance at rest of the equivalent capacitor of the damping means,
C' is the variation in capacitance due to a displacement x,
$V_0$ is the DC voltage polarising the RC couple(s),
$\gamma_m$ is the mechanical damping of the system.

The real part and the imaginary part are separated to obtain a negative inertia term that modifies the resonant frequency of the system;

$$\frac{C'^2 R^2 \cdot V_0^2 \omega^2 C}{1 + R^2 C^2 \omega^2},$$

and
an electromechanical damping term:

$$\frac{C'^2 R \cdot V_0^2 \omega}{1 + R^2 C^2 \omega^2}.$$

The value of additional damping due to electromechanical coupling below the cut-off frequency can be considered to be proportional to $\gamma = C'^2 R \cdot V_0^2$.

Therefore, damping effectively varies as a function of the electrical resistance.

Figure 4B:
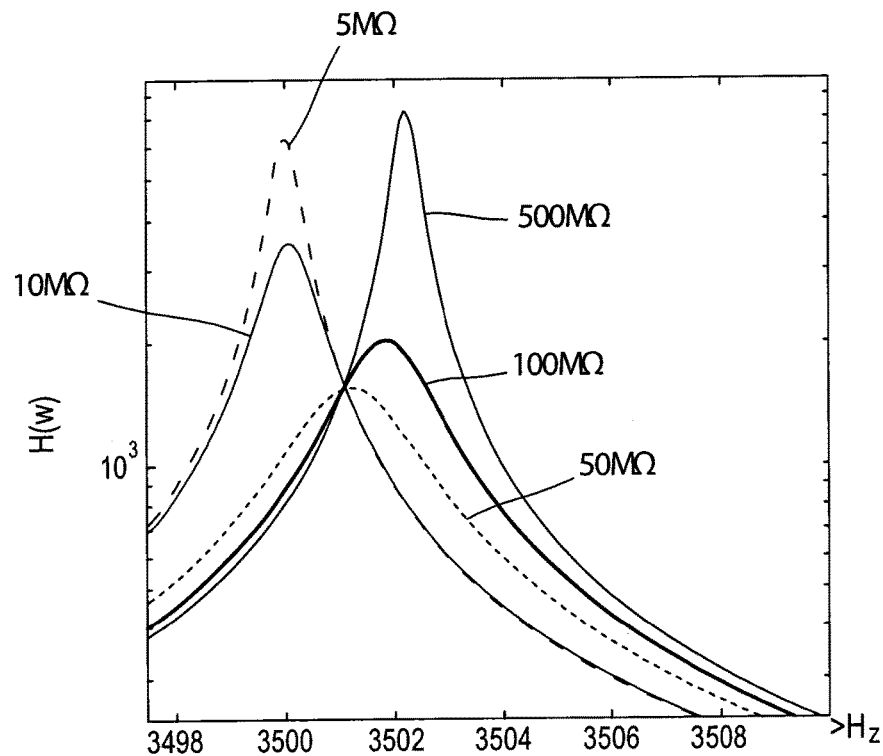
FIG. 4B is a zoom of FIG. 4A that is a graphic view of the system transfer function for several values of the electrical resistance.

FIG. 4B shows a zoom of the transfer function as a function of the frequency in Hertz for different values of the electrical resistance of the damping means.

FIG. 4B confirms that the resonant frequency varies as a function of the value of the resistance.

It also confirms that damping is not proportional to the value of the resistance. Damping increases below a certain resistance value, and beyond this value, damping reduces. The cut-off frequency is then reached.

Damping may be controlled by means of the value of the resistor(s) and the power supply source.

Figure 5:
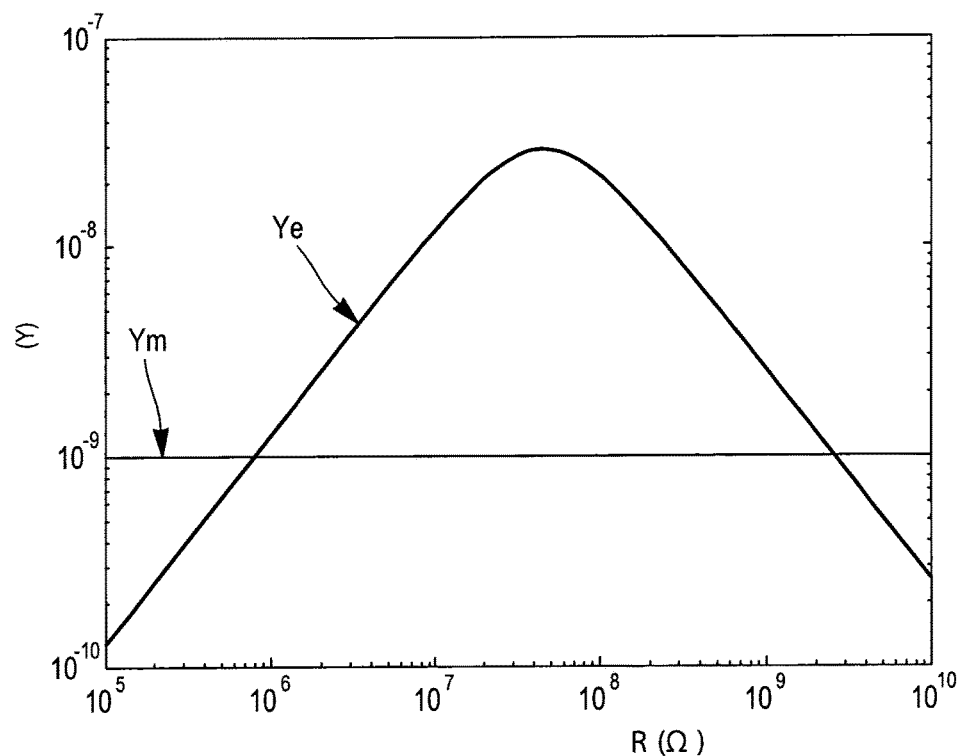
FIG. 5 is a graphic view of damping produced by the damping means on the inertial mass as a function of the value of the electrical resistance of the damping means.

FIG. 5 shows the variation of mechanical damping γm and electromechanical damping γe as a function of the resistor R for a given frequency. The electromechanical damping is written $$\frac{C'^2 R \cdot V_0^2}{1 + R^2 C^2 \omega^2}$$

The mechanical damping γm is constant and is independent of the value of R. The electromechanical damping γe varies as a function of R and passes through a maximum.

The frequency in the example shown was fixed at 3500 Hz.

Electromechanical damping reaches its maximum for an electrical resistance R value equal to 45.5 MΩ.

Figure 6:
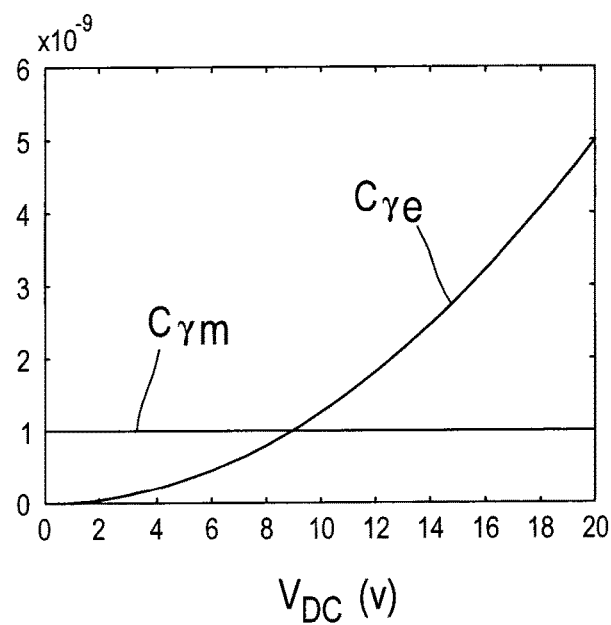
FIG. 6 is a graphic view of the damping coefficient produced by the damping means on the inertial mass as a function of the power supply voltage of the damping means.

FIG. 6 shows the variation of the mechanical damping coefficient Cγm and the electromechanical damping coefficient Cγe as a function of the different power supply voltages of the damping means for a resistance of 10 MΩ.

Mechanical damping γm is constant and is independent of the value of the power supply voltage. Electromechanical damping γe increases quadratically with the power supply voltage.

Figure 7:
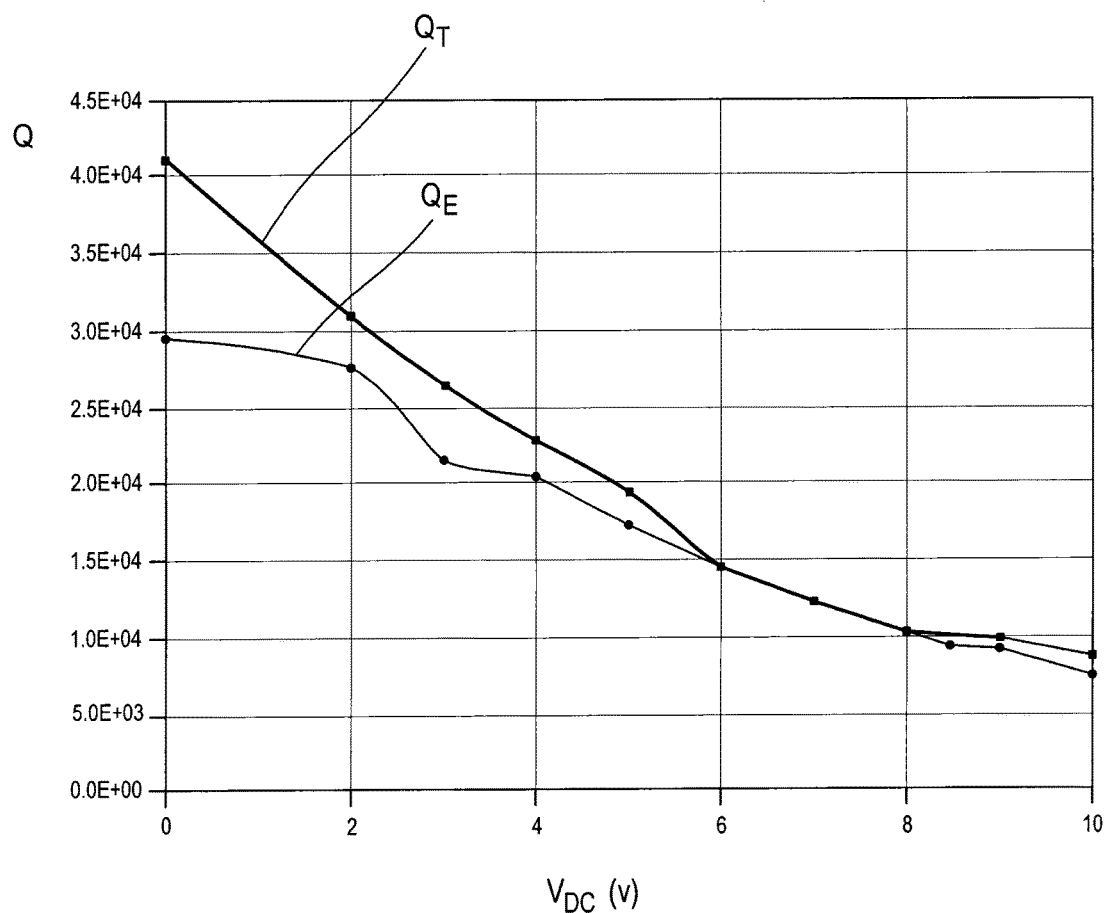
FIG. 7 is a graphic view of the quality factor of the system as a function of the power supply voltage of the damping means.

FIG. 7 also shows the experimentally measured variation of the quality factor $Q_E$ and the variation of the theoretical quality factor $Q_T$ as a function of the power supply voltage. Therefore, the quality factor drops with the increase in the control voltage. The value of the quality factor can then be easily controlled as a function of the power supply voltage.

Thus, by choosing the resistor R and/or the value of the power supply source or the power supply current, it is possible to obtain the required damping and therefore the required quality factor. Consequently, with the invention, the quality factor of the structure can be adjusted very easily and it may even be controlled during operation of the structure by controlling the value of the DC power supply.

As mentioned above, the damping means may comprise a variable area or a variable air gap capacitor.

In the case of one or several variable air gap capacitors, the capacitance C is written:

$$C = \frac{\varepsilon_0 S}{g}$$

Where S is the area of the plates, g is the air gap and $\varepsilon_0$ is the permittivity of air.

Damping is proportional to the variation of the capacitance C'.

C' is written:

$$C' = \frac{\partial C}{\partial x} = \frac{\varepsilon_0 S}{2(g-x)^2}$$

where x is the displacement between two capacitor plates.

C' is then proportional to the inverse of the square of the value of the air gap.

Consequently, damping is proportional to the variation of the air gap.

Due to the constraints of the fabrication processes used in microelectronics, variable air gap capacitors have the advantage of having a better C'/C ratio than variable area capacitors, so that higher damping can be achieved. However, their use can lead to pull-in phenomena and generate higher negative stiffnesses than interdigitised combs.

Pull-in is an electrostatic effect present for example in variable air gap capacitors (plane-plane). When a voltage is applied between the two mobile plates of the capacitor, they move towards each other. If the voltage is too high, the two plates will stick to each other; This is called the critical voltage, the pull-in voltage.

Furthermore, the use of a variable air gap capacitor can maximise the effect of damping by air film. Thus, apart from damping by electromechanical coupling, the damping means amplify damping by air film.

In another embodiment, the damping means could also include an inductor. Such damping means can obtain order 2 electromechanical coupling, and thus a quality factor of more than 1.

The MEMS may be a gyroscope. The damping means are then preferably controllable damping means capable of modifying the damping and therefore modifying the quality factor of the gyroscope during operation of the gyroscope.

Advantageously, the damping means are controlled such that the quality factor is low when the gyroscope is started in operation, which has the effect of widening the start up range of the phase locked loop (PLL). The damping means are then controlled to increase the quality factor of the gyroscope.

Figure 8:
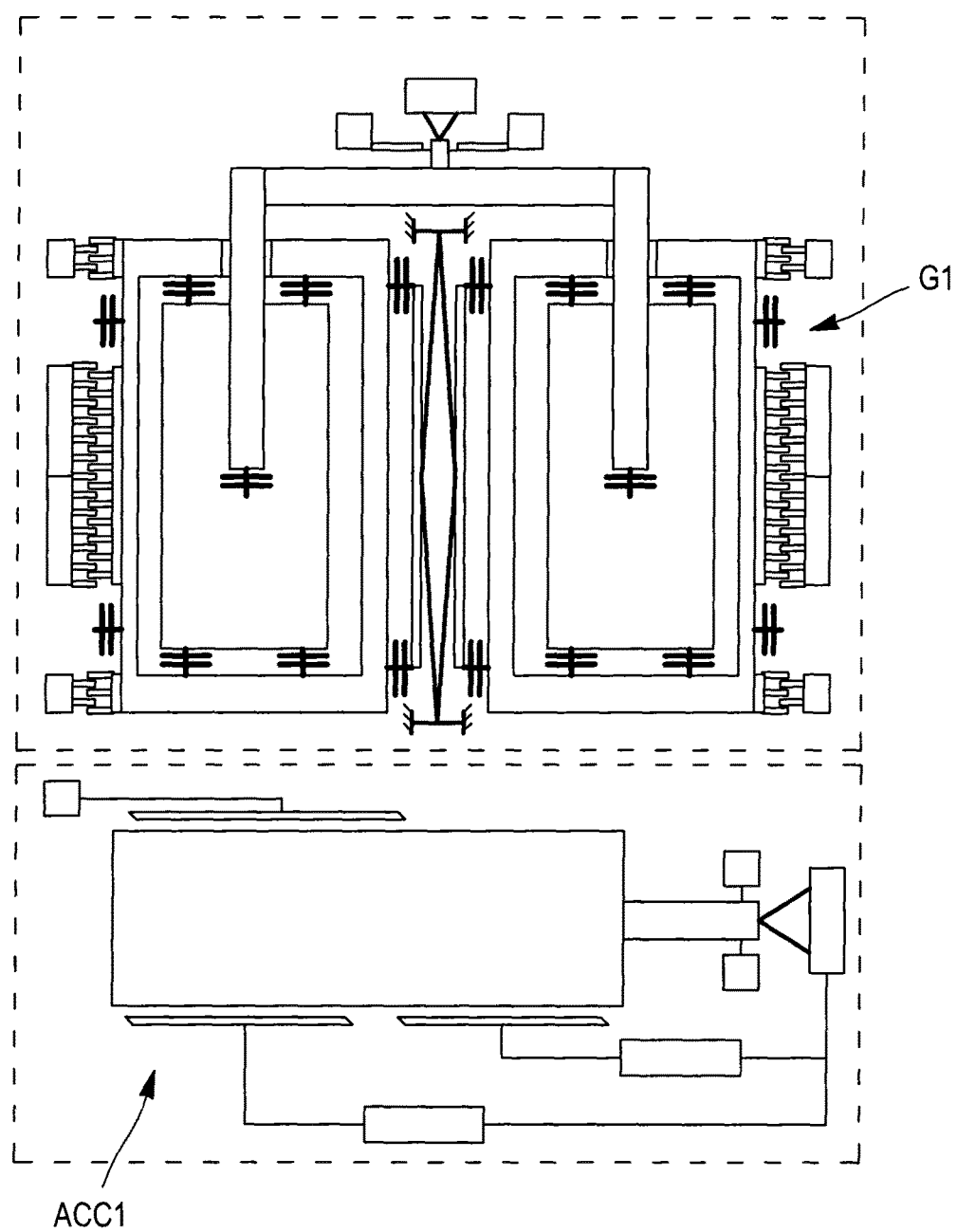
FIG. 8 is a top view of a device including a gyroscope and an accelerometer, the accelerometer being provided with damping means according to the invention.

The MEMS may be an accelerometer that is encapsulated at low pressure, the damping means are then such that they reduce the quality factor of the accelerometer. This low pressure encapsulation is particularly attractive if the accelerometer is encapsulated with a gyroscope that requires low pressure for operation. Thus, systems with combined gyroscope G1-accelerometer Acc1 can be made while obtaining good operation of the gyroscope and the accelerometer. Such a device is shown in FIG. 8.

The accelerometer ACC1 comprises damping means according to the invention.

The damping means may also be applied to any inertial sensor such as a pressure sensor or a magnetometer.

In one particularly interesting embodiment, the energy dissipated during damping originates solely from the resonator. The current in the dissipation loop is AC and the voltage is DC (and stationary), therefore the power output by the DC voltage source during a period is globally equal to 0. Consequently, the added energy is zero.

Figure 12:
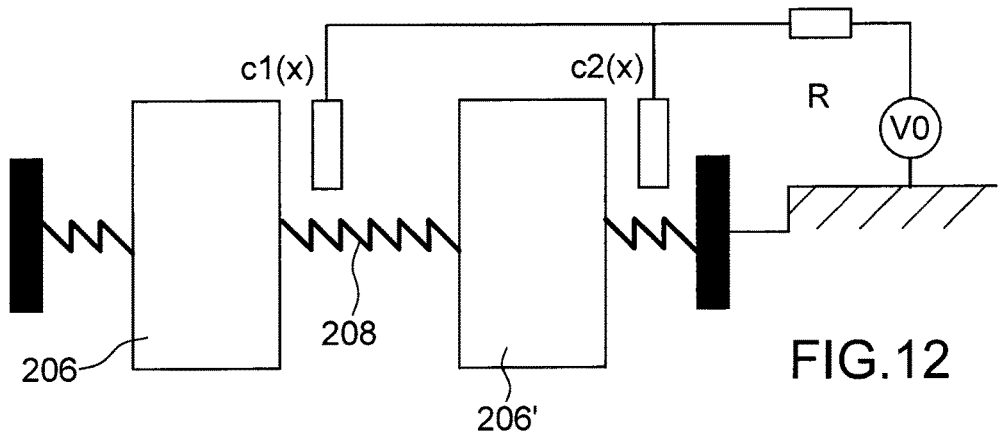
FIG. 12 is a diagrammatic view of an example embodiment of a system according to the invention using two inertial masses which are coupled.

On FIG. 12, are represented RC assemblies allowing to damp in a preferential manner a vibration mode.

On FIG. 12, the system comprises two inertial masses 206, 206' coupled by a coupling spring 208.

A capacitor C1, C2 is associated to each mass and both capacitor are associated to the same resistor and are connected in parallel. The vibration modes for which C(x)=C1(x)+C2(x) are kept constant during the movement associated to the mode only are non damped.

It is possible to damp the antiphase mode by using to distinct capacitors.

Figure 13:
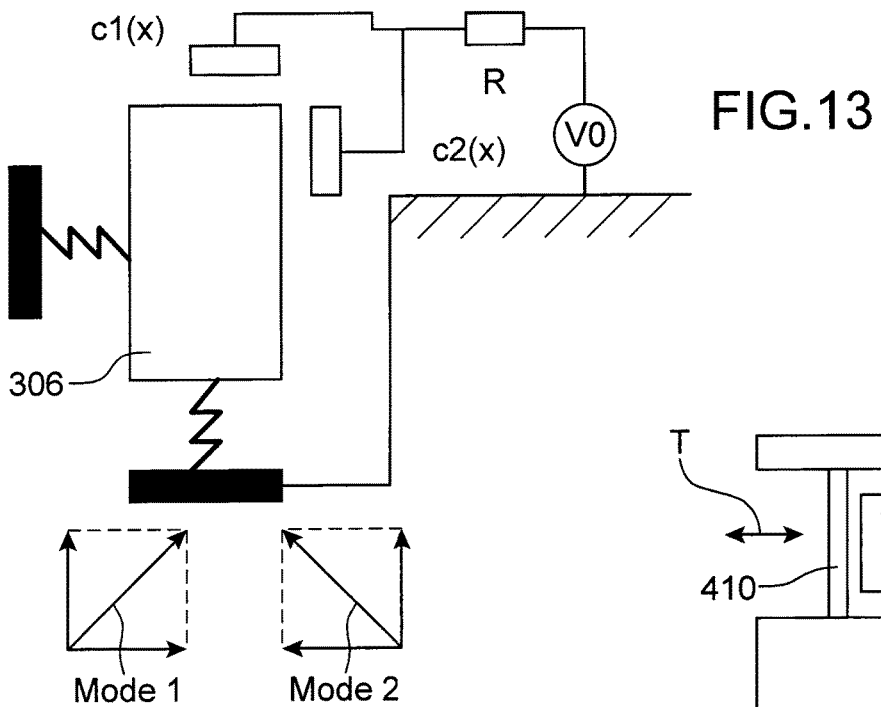
FIG. 13 is a diagrammatic view of an example embodiment of a system according to the invention in which the two assemblies R, C act on the inertial mass in a non-symmetrical manner.

On FIG. 13, the system comprises a single inertial mass 306n the two capacitors C1, C2 acting on two sides of the mass, which are perpendicular to each other. The two capacitors are also associated to the same resistor. Mode 1 may be damped.

Figure 14:
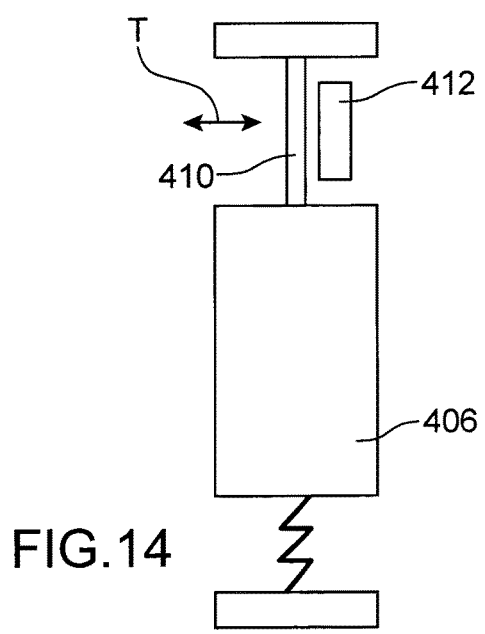
FIG. 14 is a diagrammatic view of an example embodiment of an accelerometer in which the detection means use a gauge, the variation of resonance frequency of which being measured.

On FIG. 14, a example of a inertial system is shown, for example an accelerometer in which the means to detect the motion of the mass 406 are formed by a gauge 410, which is for example a piezoresistive gauge, but in which the detection does not use the variation of the electrical variation of the gauge, but the variation of the resonance frequency on the transversal mode of the gauge, which is designated by the arrow T. To reach a good resolution of the variation of the resonance frequency of the gauge, it shall have a good quality factor. For example, the variation of the resonance frequency is measured by a capacitive detection 412.

The accelerometer is advantageously mounted in a cavity under lox pressure, the vibration mode of the accelerometer is damped with damping means of the invention (not shown), and the gauge, an more generally the transduction elements, have good quality factors due to low pressure.

We will now disclose an example embodiment of a MEMS structure with damping means according to this invention.

In the example described below, the MEMS structure is an accelerometer but any other device could be made using this process.

Figure 9A:
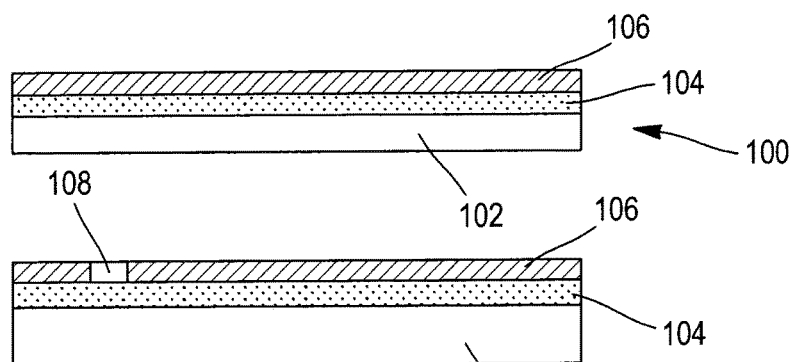
FIGS. 9A to 9I are diagrammatic views of the different steps in making a system according to one embodiment of the invention.

In the example described, an SOI (Silicon On Insulator) substrate is used. The substrate 100 comprises a silicon layer 102 generally called Bulk, an oxide layer 104 and a silicon layer 106 covering the oxide layer 104. The substrate 10 is shown diagrammatically in FIG. 9A.

For example, the thickness of the surface silicon layer 106 is between 0.1 µm and 100 µm and the thickness of the buried oxide layer 104 is between 0.5 µm and 5 µm. For example, the thickness of the silicon layer is 250 nm and the thickness of the oxide layer is 1 µm.

During a first step, doping agents are implanted over the entire layer except in a given zone 108 in which the electrical resistor of the damping means will be formed. For example, a photosensitive mask can be used to delimit the zone to be implanted that is subsequently eliminated.

Preferably, the next step is to homogenise the doping agents implanted throughout the thickness of the silicon layer 106 by annealing, for example at 1050° C. for 5 minutes.

Figure 9B:
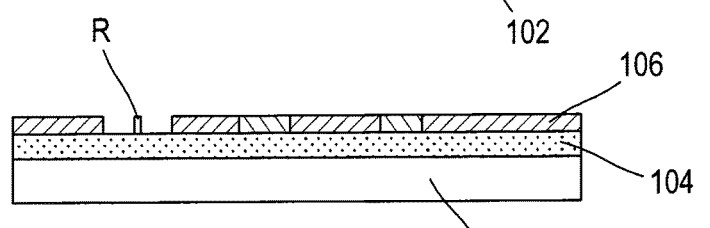

The element thus formed is shown in FIG. 9B.

During a next step, lithography is done to delimit the resistor R or resistive gauge that will form damping means, and the silicon layer 106 is then etched stopping on the oxide layer 104. For example, Deep Reactive Ion Etching (DRIE) is done. In the example shown, the piezoresistive gauge(s) 24 that will be used to detect displacement of the mobile mass are made simultaneously.

Figure 9C:
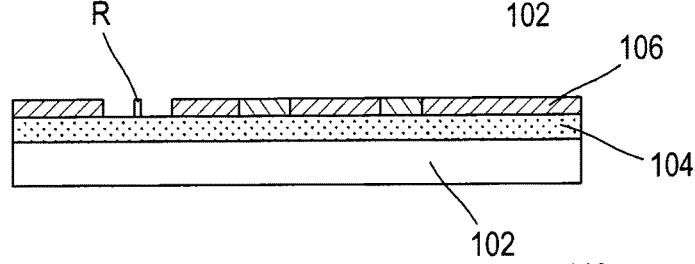

The element thus formed is shown in FIG. 9C.

An $SiO_2$ layer 110 is formed on the etched silicon layer 106 in a next step, for example by Higher Density Plasma (HDP) over a depth of 250 nm.

This layer forms a protective layer for the resistor R made as described above and the piezoresistive gauges 24.

Figure 9D:
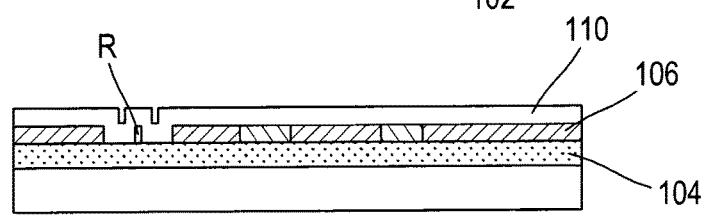

The element thus formed is shown in FIG. 9D.

In a next step, lithography is done on the layer 110 so as to delimit a protective portion 112 of the resistor R and a portion 114 protects the resistive gauge(s), the protective portions are provided to protect the resistor and the gauges against subsequent etching operations.

The next step is to etch the layer 110 stopping on the silicon.

The stencil is removed and a cleaning step takes place.

Figure 9E:
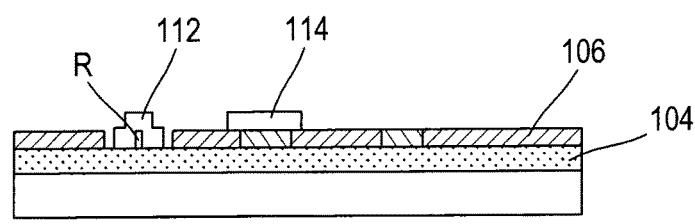

The element thus formed is shown in FIG. 9E.

During a subsequent step, a silicon layer 116 is formed on the element in FIG. 10E, for example by epitaxial growth over a thickness of 20 µm, preferably this growth takes place in four steps so as to form four 5 µm layers.

A mechanical-chemical polishing step is then done.

Figure 9F:
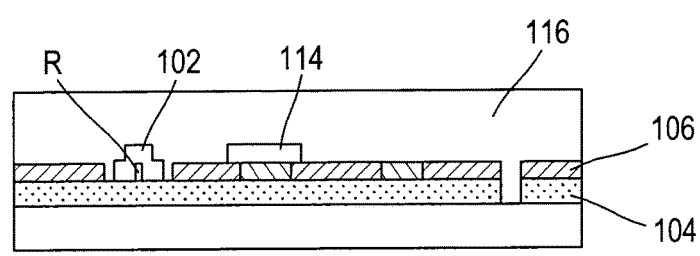

The element thus formed is shown in FIG. 9F.

A layer of AlSi 118 is formed in the next step.

Figure 9G:
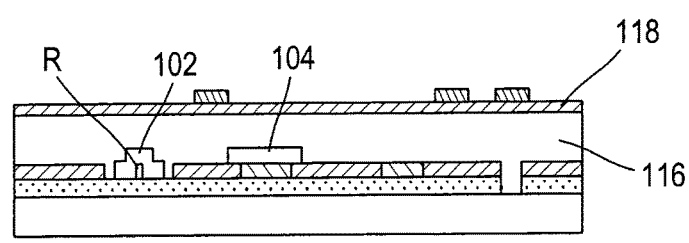

The element thus formed is shown in FIG. 9G.

In a next step, lithography is applied so as to define the MEMS. A stencil is deposited and then the layers 116 and 118 are etched simultaneously.

A second etching of the layer 118 is done to define the contact made and the conducting tracks.

Cleaning can then take place.

Figure 9H:
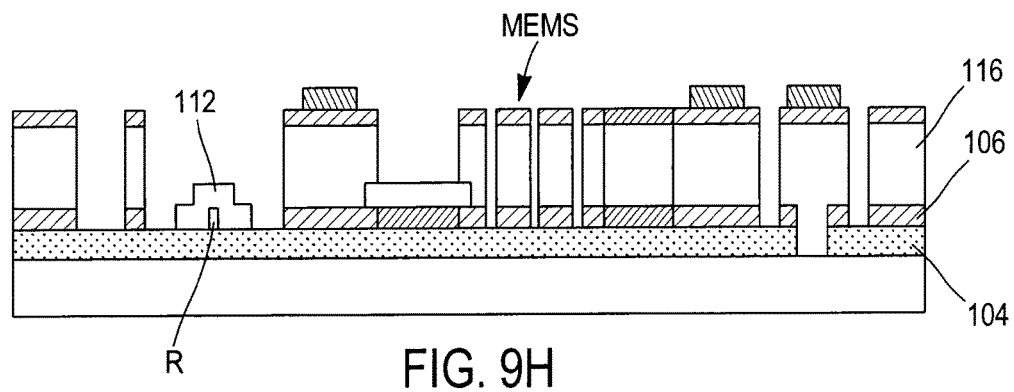

The element thus formed is shown in FIG. 9H.

Finally, the suspended structures are released for example by etching with hydrofluoric acid; for example time etching may be used. The accelerometer and the gauge forming the electrical resistance of damping means are thus released.

Figure 9I:
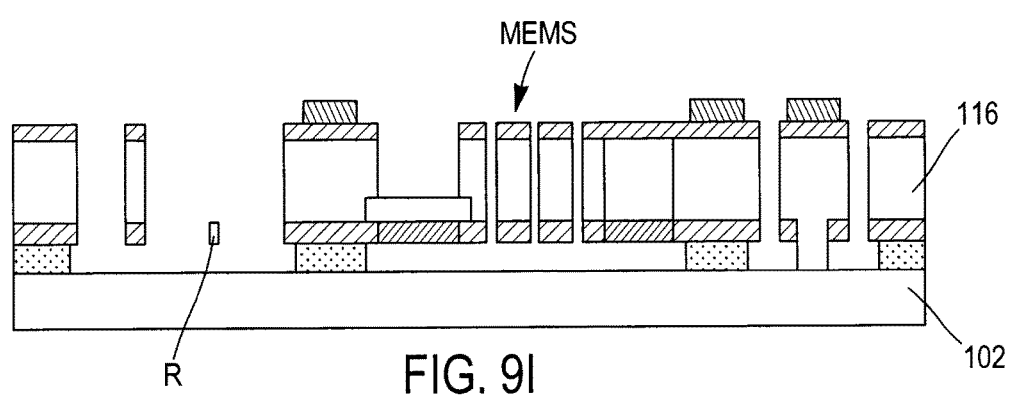

The element thus formed is shown in FIG. 9I.

A cap is advantageously transferred onto the substrate on which the device thus obtained is installed. Sealing may done in a known manner.

The process for making the accelerometer structure and damping means is not much more complex than the process for making the accelerometer alone. A mask level is necessary for integration of damping means according to the invention into a microelectronic structure.

As a variant, the resistor(s) can be made on the cap and it (they) can then be connected with the capacitor(s) made on the substrate supporting the device. The steps for making the resistor(s) are similar to the steps described above for making the resistor(s) on the substrate supporting the device.

In this case, during assembly of the substrate with the device mounted on it, contacts are provided to make the electrical connection between the resistor(s) and the capacitor(s) made on the substrate supporting the device, so as to form a eutectic, for example Gold/Silicon. As a variant, it may be an Al/Ge or Au/Sn eutectic.

The invention claimed is:

1. A microelectromechanical and/or nanoelectromechanical structure comprising:
    at least one fixed part;
    at least one suspended part suspended from the fixed part; and
    an electromechanical damper that damps the displacement of the suspended part suspended from the fixed part, the electromechanical damper comprising
        at least one DC power supply source, and
        at least n assemblies comprising an electrical resistor and comprising a variable capacitor or a subassembly of variable capacitors connected in parallel, the variable capacitor or the subassembly being connected in series with the electrical resistor, the electrical resistor being partly formed by the fixed part, the n assemblies being connected in parallel on the DC power supply source, so as to form n loops with a same power supply source or each assembly being connected to a DC power supply source, each variable capacitor being formed partly by the suspended part and partly by the fixed part such that displacement of the suspended part causes a variation of the capacitance of the respective variable capacitor.

2. The structure according to claim 1, wherein the electrical resistors of at least two assemblies are a same.

3. The structure according to claim 1, wherein n is an even number and the structure comprises a fixed part with n electrically independent patterns, the n variable capacitors in the n assemblies being formed by the n patterns in the fixed part, which are arranged on each side of the suspended part relative to a plane of symmetry of the suspended part.

4. The structure according to claim 1, wherein the suspended part forms an inertial mass that comprises a comb with n teeth, and the fixed part comprises a comb with n teeth forming n patterns, the two combs being interdigitised such that one tooth of one comb and one tooth of another comb together form a variable capacitor.

5. The structure according to claim 1, wherein at least one variable capacitor is a variable air gap capacitor.

6. The structure according to claim 1, wherein at least one variable capacitor is a variable area capacitor.

7. The structure according to claim 1, wherein at least one electrode of at least one variable capacitor is formed by at least one test electrode of the structure.

8. The structure according to claim 1, wherein the electromechanical damper is controllable so as to apply a variable damping force.

9. The structure according to claim 1, further comprising an inertial sensor configured to detect displacements of the suspended part.

10. The structure according to claim 9, wherein the inertial sensor is an accelerometer.

11. The structure according to claim 9, further comprising means of exciting at least part of the suspended part.

12. The structure according to claim 11, wherein the electromechanical damper is controllable so as to apply a variable damping force, and in which the inertial sensor is a gyroscope.

13. A device comprising:
at least two inertial sensors integrated onto a single substrate, at least one of the two inertial sensors being an inertial sensor configured to detect displacements of a suspended part in a structure, the structure including at least one fixed part, the suspended part suspended from the fixed part, and an electromechanical damper that damps the displacement of the suspended part suspended from the fixed part, the electromechanical damper comprising at least one DC power supply source, and at least n assemblies comprising an electrical resistor and comprising a variable capacitor or a subassembly of variable capacitors connected in parallel, the variable capacitor or the subassembly being connected in series with the electrical resistor, the electrical resistor being partly formed by the fixed part, the n assemblies being connected in parallel on the DC power supply source, so as to form n loops with a same power supply source or each assembly being connected to a DC power supply source, each variable capacitor being formed partly by the suspended part and partly by the fixed part such that displacement of the suspended part causes a variation of the capacitance of the respective variable capacitor.

14. The device according to claim 13, further comprising a gyroscope and an accelerometer, the gyroscope and the accelerometer being encapsulated in a cavity, the electromechanical damper being such that the accelerometer has a low quality factor.

15. A production process for making a structure or a device, the structure or device including
at least one fixed part,
at least one suspended part suspended from the fixed part, and
an electromechanical damper that damps the displacement of the suspended part suspended from the fixed part, the electromechanical damper comprising
at least one DC power supply source, and
at least n assemblies comprising an electrical resistor and comprising a variable capacitor or a subassembly of variable capacitors connected in parallel, the variable capacitor or the subassembly being connected in series with the electrical resistor, the electrical resistor being partly formed by the fixed part, the n assemblies being connected in parallel on the DC power supply source, so as to form n loops with a same power supply source or each assembly being connected to a DC power supply source. each variable capacitor being formed partly by the suspended part and partly by the fixed part such that displacement of the suspended part causes a variation of the capacitance of the respective variable capacitor, the production process comprising:
making the electrical resistor of the electromechanical damper on or in a substrate that at least partly forms the fixed part;
making the suspended part and the fixed part of the structure; and
releasing at least the suspended part.

16. The production process according to claim 15, wherein the making of the electrical resistor comprises doping so as to control the electrical resistivity of part of a material in which the electrical resistor is made.

17. The production process according to claim 15, further comprising forming a protective layer on the electrical resistor before the making of the suspended part and the fixed part of the structure.

* * * * *